United States Patent
Baudin et al.

(10) Patent No.: US 10,020,283 B2
(45) Date of Patent: Jul. 10, 2018

(54) DIRECT METAL BONDING METHOD

(71) Applicant: COMMISSARIAT A L'ENERGIE ATOMIQUE ET AUX ENERGIES ALTERNATIVES, Paris (FR)

(72) Inventors: Floriane Baudin, Grenoble (FR); Léa Di Cioccio, Saint Ismier (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/895,529

(22) PCT Filed: Jun. 2, 2014

(86) PCT No.: PCT/FR2014/051306
§ 371 (c)(1),
(2) Date: Dec. 3, 2015

(87) PCT Pub. No.: WO2014/195621
PCT Pub. Date: Dec. 11, 2014

(65) Prior Publication Data
US 2016/0133598 A1 May 12, 2016

(30) Foreign Application Priority Data
Jun. 3, 2013 (FR) .................................... 13 55043

(51) Int. Cl.
*H01L 23/48* (2006.01)
*H01L 23/00* (2006.01)
(Continued)

(52) U.S. Cl.
CPC ............ *H01L 24/83* (2013.01); *H01L 21/187* (2013.01); *H01L 24/27* (2013.01);
(Continued)

(58) Field of Classification Search
CPC ..... H01L 24/83; H01L 24/27; H01L 27/0688; H01L 2224/83895; H01L 2224/27848; H01L 33/0079; H01L 21/187
See application file for complete search history.

(56) References Cited

U.S. PATENT DOCUMENTS

2006/0102933 A1* 5/2006 Yamamoto .......... H01L 33/0079
257/200
2008/0182101 A1* 7/2008 Carcia .................. C23C 16/403
428/332

(Continued)

OTHER PUBLICATIONS

Sep. 26, 2014 International Search Report issued in International Patent Application No. PCT/FR2014/051306.

*Primary Examiner* — A. Sefer
(74) *Attorney, Agent, or Firm* — Oliff PLC

(57) ABSTRACT

Method including the steps of a) Providing a first stack including a first substrate on which is deposited a first metal layer including a first metal, and a first solubilization layer distinct from the first metal layer, the first solubilization layer including a first getter material configured to solubilize the oxygen, b) Providing a second stack including a second substrate on which is deposited a second metal layer including a second metal, c) Contacting the first metal layer and the second metal layer so as to obtain a direct metal bonding between the first metal layer and the second metal layer, and d) Applying a heat treatment for annealing the bonding.

19 Claims, 2 Drawing Sheets

(51) Int. Cl.
  *H01L 21/18*  (2006.01)
  *H01L 27/06*  (2006.01)
  *H01L 33/00*  (2010.01)

(52) U.S. Cl.
  CPC ...... *H01L 27/0688* (2013.01); *H01L 33/0079* (2013.01); *H01L 2224/27848* (2013.01); *H01L 2224/83895* (2013.01)

(56) References Cited

U.S. PATENT DOCUMENTS

| | | | |
|---|---|---|---|
| 2010/0170936 A1 | 7/2010 | Tu et al. | |
| 2010/0171195 A1 | 7/2010 | Tobe et al. | |
| 2011/0088403 A1* | 4/2011 | Swanson | F02K 1/1223 60/771 |
| 2011/0156190 A1* | 6/2011 | Mori | G01J 1/0252 257/433 |
| 2011/0298083 A1 | 12/2011 | Yoneda | |
| 2012/0208033 A1* | 8/2012 | Weigel | B32B 17/10018 428/447 |
| 2012/0235167 A1* | 9/2012 | Odnoblyudov | H01L 33/0079 257/88 |
| 2013/0037849 A1* | 2/2013 | Cho | H01L 33/0079 257/99 |
| 2013/0221497 A1* | 8/2013 | Baillin | B81C 1/00285 257/629 |
| 2013/0285248 A1* | 10/2013 | Yin | H01L 23/49866 257/762 |
| 2014/0035167 A1* | 2/2014 | Schelling | H01L 21/4814 257/782 |
| 2014/0217593 A1* | 8/2014 | Chen | H01L 24/05 257/762 |
| 2014/0273318 A1* | 9/2014 | Ryu | B23K 1/0006 438/26 |
| 2015/0014854 A1* | 1/2015 | Gooch | H01L 23/49866 257/751 |
| 2016/0189995 A1* | 6/2016 | Gondcharton | H01L 27/0688 438/107 |

* cited by examiner

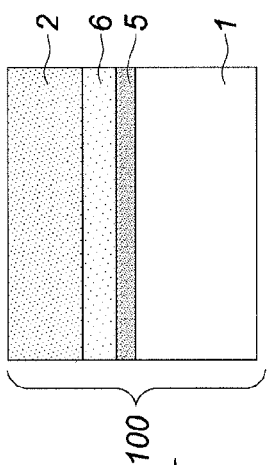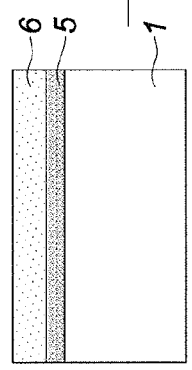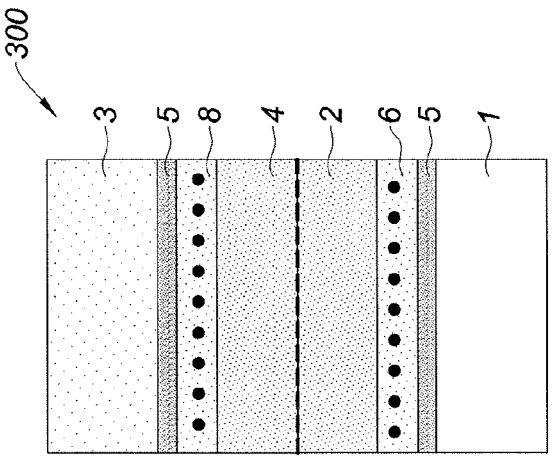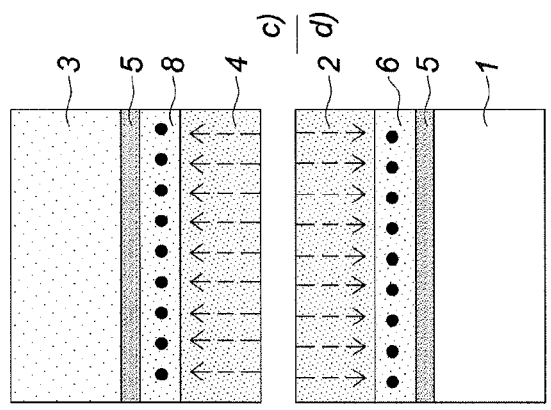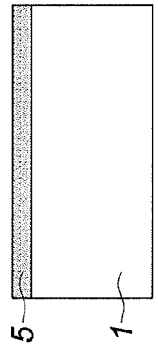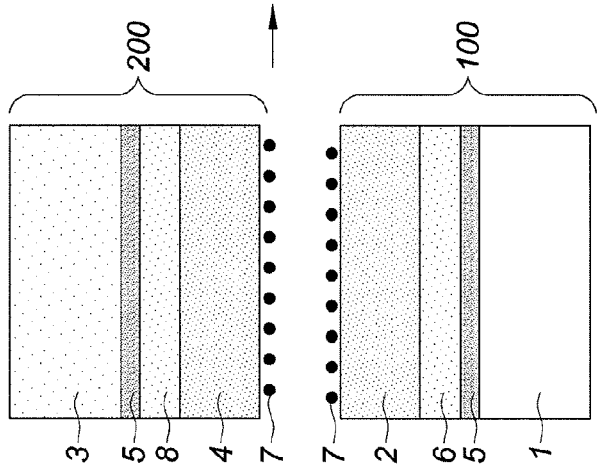

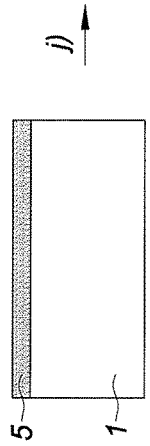
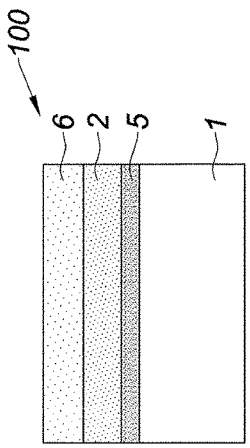
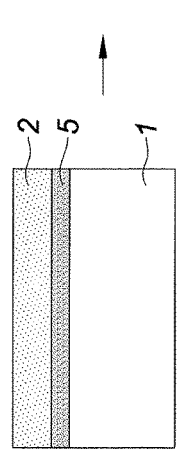
*Fig. 7 - k)*
*Fig. 8*
*Fig. 9*
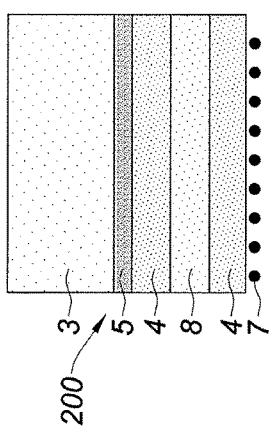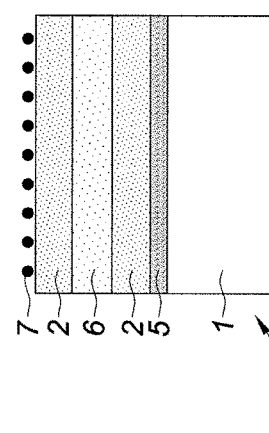
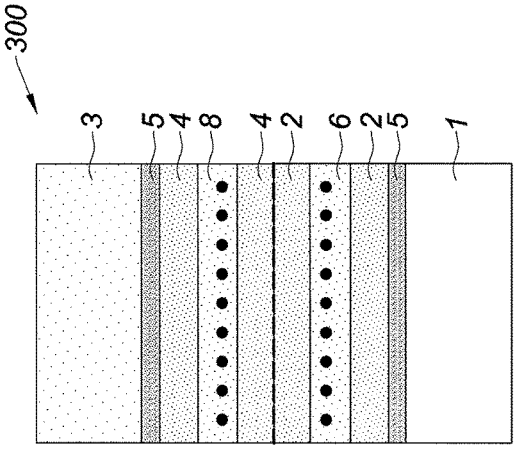
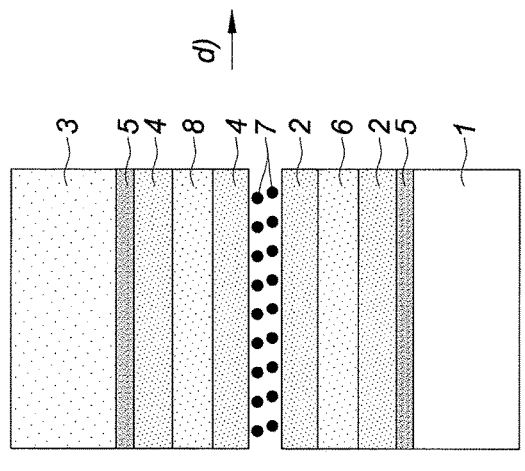
*Fig. 10 - a) b)*
*Fig. 11*
*Fig. 12*

DIRECT METAL BONDING METHOD

The present invention concerns a direct metal bonding method, in particular for applications in the field of photovoltaics, of the three-dimensional integration, in the manufacture of MEMS (Micro-ElectroMechanical System), and of LEDs (Light Emitting Diodes).

The present invention further concerns a structure comprising a direct metal bonding between two substrates of semi-conductive materials.

In this document, it is meant by direct metal bonding the bonding of two metal layers directly one on top of the other and in particular without interposition of adhesive material.

A direct metal bonding method known to the depositor implements a direct bonding of two metal layers under ambient atmosphere. Accordingly, a native oxide is formed on the surface of the metal layers before contacting, which deteriorates the quality of the bonding. The bonding energies (expressed in $J/m^2$) obtained with this technique become compatible with the desired subsequent methods (Smart Cut, mechanical thinning) only for high bonding annealing temperatures, for example above 800° C. for tungsten. Yet, these temperatures are not compatible with the methods for manufacturing integrated circuits such as BEOL (Back-End Of Line).

To overcome this drawback, it was proposed to carry out the bonding with a thermo-compression step. This method allows obtaining good quality bonding, however the efficiencies are low.

Another known method provides for a step of activating the surfaces of the metal layers under vacuum. But the implementation costs of this method are prohibitive.

The technical problem solved by the invention is to provide a direct metal bonding method with a satisfactory quality while presenting a reduced cost.

To this end, the present invention provides a direct metal bonding method comprising the following steps:

a) Providing a first stack comprising a first substrate on which is deposited a first metal layer comprising a first metal, and a first distinct solubilization layer of the first metal layer, the first solubilization layer including a first getter material configured to solubilize oxygen, b) Providing a second stack comprising a second substrate on which is deposited a second metal layer comprising a second metal, c) Contacting the first metal layer and the second metal layer so as to obtain a direct metal bonding between the first metal layer and the second metal layer, and d) Applying a heat treatment for annealing the bonding.

The expression getter material, or getter material configured to solubilize oxygen, or material for the solubilization of oxygen means in the present document a material including absorbent and/or adsorbent properties vis-à-vis gaseous molecules, thus being able to realize a chemical gas pump, in particular oxygen. Such properties may be obtained by the molecular composition of the material and/or its microscopic or nanoscopic structure. These materials are for example metals such as titanium, zirconium, hafnium, or metal alloys of these metals or of other suitable metals. The adsorption properties of the oxygen of getter materials are specific to the considered material, for example titanium allows to adsorb about 33 atomic % of oxygen, hafnium and zirconium about 20 atomic %.

The expression heat treatment for annealing the bonding means in the present document a heat treatment enabling the strengthening of the direct bonding between the first metal layer and the second metal layer obtained in step c) so as to obtain a high bonding energy.

It is also understood in the present document that, when a first layer is deposited on a substrate or on a second layer, the first layer may be deposited directly or indirectly on the substrate or on the second layer. Thus, it is conceivable that one or more intermediate layer(s) can be interposed between the first layer and the substrate or between the first layer and the second layer.

The method according to the invention allows bonding a first and a second metal layers directly one on top of the other so as to ensure an electrical conduction in a direction normal to the first and second layers. Such type of electrical conduction is also called vertical conduction.

In addition, the first and second metal layers are bonded in a thermally stable manner, that is to say without the appearance of bubbles at the bonding or even detachment interface during heat treatments.

Moreover, the energy required to separate the first and the second metal layers called bonding energy is increased.

The native oxide, formed in air under ambient atmosphere on the metal layers before their contacting, is encapsulated at the bonding interface, which makes it impossible to achieve a high bonding energy between metals.

However, the solubilization layer adapted to solubilize gaseous molecules from the surrounding atmosphere also allows capturing oxygen originating from the native oxide on the metal layers in contact with the solubilization layer.

The solubilization layer thus promotes the direct metal bonding process by promoting the diffusion of oxygen through metal up to the getter material, starting at a certain temperature. When there is more oxide, the two metals are in intimate contact, thus enabling an inter-diffusion.

Thus, the method according to the invention enables a direct metal bonding of high quality without passing through neither a vacuum process nor a thermo-compression step nor a bonding annealing heat treatment at high temperature, and advantageously without annealing at a temperature above the activation temperature of the getter material.

Moreover, this strong bonding energy allows carrying out thereafter mechanical thinning operations or other steps generating stresses on the assembly, performed in particular for the manufacture of electronic devices.

According to one possibility, step d) is carried out under a pressure less than or equal to about 0.1 MPa applied on either side of the first and second bonded stacks. This pressure is in particular the maximum pressure applicable by the stylus used for the bonding.

It is thus possible to carry out the metal bonding with a bonding energy of more than 2 $J/m^2$ without using a thermocompressive step, the latter requiring the application of a minimum pressure of 0.2 MPa and generally a pressure comprised between 5 and 10 MPa according to the temperature used.

Advantageously, the method comprises a step e) comprising the application of an activation heat treatment configured to solubilize oxygen. Thus, the activation heat treatment allows activating the first getter material which is then configured to solubilize oxygen originating in particular from the native oxide formed on the metal layers.

According to a variant, step e) is carried out at least in part by step d). Thus, the activation of the getter material is obtained after the direct metal bonding between the first and the second metal layers.

According to one possibility, step e) is carried out at least in part prior to the contacting step c). Thus, the activation of the getter material is obtained before the direct metal bonding between the first and the second metal layers.

Preferably, the method comprises prior to step a) a step j) consisting of depositing the first metal layer according to deposition conditions promoting the presence of grain boundaries.

More preferably, the method comprises prior to step b), a step jj) consisting of depositing the second metal layer according to deposition conditions promoting the presence of grain boundaries.

Indeed, the presence of grain boundaries increases the ability of the metal layers to diffuse oxygen up to the solubilization layer. The greater number of grain boundaries, the higher the diffusion of oxygen.

Preferably, the method comprises prior to step a) a step j) consisting of depositing the first metal layer according to a structure at least in part of the columnar type.

Even more preferably, the method comprises prior to step b), a step jj) consisting of depositing the second metal layer according to a structure at least in part of the columnar type.

Indeed, the columnar structure of the first and second metal layers, that is to say a structure including metal grain boundaries perpendicular to the surface of the layers, promotes the diffusion of oxygen from the native oxide to the matrix of the solubilization layer in which oxygen can be solubilized.

A deposition method used to obtain columnar structures is for example the CVD (Chemical Vapor Deposition) or PVD (Physical Vapor Deposition) in particular implemented by cathode sputtering or evaporation. The conditions of PVD depositions are for example described in A. Thornton, « High Rate Thick Film Growth », Annual Review of Materials Science, vol. 7, No. 1, p. 239-260, 1977. To obtain a columnar structure, the conditions leading to the formation of the areas 1, T and 2 of the Thornton diagram are for example preferred (FIG. 1b for example). Indeed, they lead to the formation of many grain boundaries favorable to the diffusion of oxygen. Thus, if we consider that T is the temperature of the substrate and Tm is the melting temperature of the metal layer, the deposition is advantageously carried out with a ratio T/Tm comprised between 0.1 and 0.5 and an argon partial pressure of 1 to 30 mTorr.

In addition, the first and second metal layers are deposited so as to have small grain sizes. This can be obtained in particular by avoiding re-crystallization and grain growth in the deposited metal layers. Grain boundaries promoting the diffusion of oxygen are thus more numerous, which participates in the formation of a large number of intra-columnar vacuums favorable to gaseous diffusion.

According to a particular arrangement, the first and second metal layers are deposited over a thickness comprised between about 5 nanometers and 5 micrometers. Thus, this thickness makes planarization operations of the surface possible if necessary, for example by CMP consuming material, before proceeding to the bonding.

Preferably, the exposed surface of the first and second metal layers is prepared for the direct bonding, in particular until achieving a roughness of 0.7 nanometers RMS. These RMS values are determined by atomic force microscopy AFM on a field of 20×20 micrometers.

According to one arrangement, said second stack further comprises a second solubilization layer distinct from the second metal layer, the second solubilization layer including a second getter material configured to solubilize oxygen. The presence of a second solubilization layer promotes good capture of oxygen originating from the native oxide of one or both of the metal layers.

According to one possibility, the first getter material for the solubilization of oxygen comprises an alloy of the first metal and of the first getter material and/or the second material for the solubilization of oxygen comprises an alloy of the second metal and of the second getter material. The alloy allows obtaining a mechanically resistant interface between the solubilization layer and the metal layer.

Preferably, step j) includes a step of depositing the first solubilization layer on the first substrate before depositing the first metal layer. Thus, the first metal layer is deposited directly on the first solubilization layer, which allows limiting the distance between the native oxide and the getter material for the solubilization of oxygen, thereby promoting the capture of oxygen.

Advantageously, step jj) includes a step of depositing the second solubilization layer on the second substrate before depositing the second metal layer. This also promotes the capture of the oxygen originating from the native oxide of the second metal.

It should be noted that the distance for which the getter material allows the solubilization of oxygen depends on the properties of the deposited metal layer (solubility of oxygen in the metal, number and size of the grain boundaries, importance of columnar structure) and of the used thermal budget, which promote more or less significantly the diffusion of oxygen to the getter material. For example, for a tungsten metal layer of columnar structure and the use of a solubilization layer of Ti, an efficient solubilization is observed with a tungsten layer thickness in the micrometer range.

According to one variant, the first solubilization layer is buried within the first metal layer and/or the second solubilization layer is buried within the second metal layer. This variant allows maintaining an optimal metal layer thickness for planarizing the surface while reducing the distance between the native oxide and the getter material for the solubilization of oxygen.

According to one possibility, step a) comprises the application of an activation heat treatment according to step e), carried out under an inert atmosphere, so as to activate said first getter material for the solubilization of oxygen.

According to another possibility, step b) comprises the application of an activation heat treatment according to step e), carried out under inert atmosphere, so as to activate said second getter material configured to solubilize oxygen.

Thus, once the first and/or the second getter material for the solubilization of oxygen is/are activated at the activation temperature specific to the considered material, the latter is able to capture gaseous species. The first and second metal layers can then be contacted for a hot-bonding. The oxygen originating from the native oxide can be diffused through the grain boundaries until it is solubilized in the solubilization layers. The temperature of the activation heat treatment of step e) is variable depending on the nature of the getter material for the solubilization of the used oxygen.

According to one variant, step a) and/or step b) comprise(s) the application of an activation heat treatment according to step e), carried out under ultrahigh vacuum, such as a pressure of less than $10^{-5}$ mbar, so as to activate at least said first getter material for the solubilization of oxygen. These conditions allow a more rapid activation or the use of a temperature which is lower than during an activation treatment under atmospheric pressure.

Preferably, the first and second solubilization layers are deposited by PVD (Physical Vapor Deposition) such as cathode sputtering or evaporation.

According to one arrangement, the first and second solubilization layers are deposited over a thickness comprised between about 2 and 500 nanometers.

According to yet another variant, the first solubilization layer and/or the second solubilization layer is/are composed of a plurality of elementary solubilization layers having various compositions.

According to another arrangement, the first and second metal layers are cold-bonded, in which case the heat treatment of step d) of strengthening the bonding is also used to perform at least in part step e) and activate the first getter material for the solubilization of oxygen and/or the second getter material for the solubilization of oxygen. The expression « cold bonded » means in the present document « bonded at room temperature ». The cold-bonding is different from the « hot-bonding » for which the stacks are heated (above room temperature) before contacting.

Advantageously, the application of the heat treatment of step d) is performed at a temperature lower than or equal to 600° C. and preferably at a temperature lower than or equal to 400° C., the bonding energy between the first metal layer and the second metal layer reaching a value greater than or equal to 1 J/m$^2$ and preferably greater than or equal to 2 J/m$^2$. Thus, thanks to the presence of the first solubilization layer and/or of the second solubilization layer, the bonding energy achieved between the first substrate and the second substrate allows carrying out steps of methods generating constraints likely to weaken the bonding, such as a mechanical thinning, a layer transfer by Smart Cut™.

Furthermore, this method allows reducing the temperature of the bonding annealing to a temperature compatible with the BEOF methods.

Preferably, the first solubilization layer and/or the second solubilization layer is/are configured to have an ability to solubilize oxygen higher than or equal to 20 atomic %.

The first and/or second getter material(s) for the solubilization of oxygen is/are selected from titanium, zirconium, palladium, hafnium, and metal alloys of these metals.

The solubilization layers have a thickness selected to absorb the oxygen which is present. For example, 15 nm of Ti are required to absorb oxygen contained in 3 nm of oxide layer.

According to one possibility, the first and/or second getter material is selected from titanium, zirconium, palladium, hafnium, vanadium, and metal alloys of these metals.

Advantageously, the first metal and the second metal are selected from Ti, Al, Au, Ag, Cu, Co, Ni, Pt, Fe, Cr, Ru, Mo, Ta, Nb, Re, W and metal alloys of these metals.

It is understood that the method is all the more effective that the first metal and/or the second metal has/have a low solubility of oxygen. It is particularly the case for W for which the solubility of oxygen is less than 1 atomic %.

Also, the getter material or the alloy of getter material and metal of the first layer and/or of the second solubilization layer is selected so as to have an ability to solubilize oxygen which is more significant than that, respectively, of the metal of the first metal layer and/or of the second metal layer.

According to one possibility, step a) and/or step b) comprise(s) a step k) including the deposition of a barrier layer forming a diffusion barrier of contaminating materials directly on the first substrate and/or directly on the second substrate, the barrier layer comprising in particular a material selected from TiN, WN, TaN.

Advantageously, the first substrate and/or the second substrate is/are composed of a semi-conductive material. The structure obtained at the end of the method of the invention may thus be used in the field of 3D integration, in the field of photovoltaics for the manufacture of MEMS, or LEDs.

According to one possibility, the first substrate and/or the second substrate is/are composed of a solid material.

According to one possibility, the method comprises after step d) a step of realizing at least one micro-electronic or nano-electronic device on the first substrate and/or on the second substrate of semi-conductive material.

The first and second substrates may be composed of the same semi-conductive material as different semi-conductive materials.

The first and second used metals may be different or identical.

Similarly, the first and second getter materials may be different or identical.

The invention also provides a structure comprising a direct metal bonding interface for applications in the field of 3D integration, the structure including, successively from its base to its surface, a first substrate of a first semi-conductive material, a first solubilization layer including a first getter material configured to solubilize oxygen, a first metal layer of a first metal, distinct from the first solubilization layer and bonded by direct metal bonding to a second metal layer of a second metal, the second metal layer, a second solubilization layer distinct from the second metal layer, including a second getter material configured to solubilize oxygen and a second substrate of a second semi-conductive material.

Other aspects, aims and advantages of the present invention will become more apparent upon reading the following description of the embodiments thereof, given by way of non-limiting examples and made with reference to the accompanying drawings. The figures do not necessarily comply with the scale of all the shown elements so as to improve their readability. In the following description, for simplification, identical, similar or equivalent elements of the various embodiments have the same reference numerals.

FIGS. 1 to 6 illustrate a block diagram of the method according to one embodiment of the invention.

FIGS. 7 to 12 illustrate a block diagram of the method according to a variant according to the invention.

As illustrated in FIGS. 1 to 6, the direct metal bonding method is implemented from a first stack 100 including a first substrate 1 covered by a first metal layer 2 and from a second stack 200 including a second substrate 3 covered by a second metal layer 4.

The first substrate 1 composed of a silicon solid material is first protected, if necessary, by the deposition of a barrier layer 5 made of TiN for example, allowing to avoid contaminations of the materials that may occur during subsequent stages (FIG. 1). Then a first titanium solubilization layer 6 is deposited by PVD on the surface of the barrier layer 5 with a thickness of about 100 nanometers (FIG. 2). The first solubilization layer 6 is then covered by a first tungsten metal layer 2 deposited by CVD so as to obtain a material of columnar structure including many grain boundaries (FIG. 3). The thickness of the first metal layer 2 reaches about 500 nanometers. At the end of the deposition, the surface of the first metal layer 2 is then prepared for the bonding until achieving a roughness suitable for the direct bonding, i.e. a roughness lower than 0.7 nm RMS measured on a field of 20×20 micrometers. After preparation, its thickness is of about 250 nanometers. Handling the thus obtained first stack 100 under ambient atmosphere generates the oxidation of the first tungsten layer 2 with moisture contained in the air, which creates a surface native oxide 7 (FIG. 4).

In parallel, the second stack 200 is prepared for the direct metal bonding with the first stack 100. A barrier layer 5 of TiN followed by a second titanium solubilization layer 8 then by a second tungsten metal layer 4 are deposited at the surface of a second silicon substrate 3. The exposed surface of the second metal layer 4 is prepared for a direct bonding (FIG. 4). A native oxide 7 is generated in the open air on the surface to be bonded, in the same way as the first stack 100.

An activation heat treatment of the getter material for the solubilization of oxygen is then applied at 400° C. so as to be able to solubilize oxygen originating from the native metal oxide 7 of the first and second metal layers 2, 4 (step e). The oxygen of the native oxide 7 diffuses, through the grain boundaries, first and second metal layers 2, 4 in order to be solubilized in the first and second solubilization layers 6, 8 (FIG. 5).

Then, according to step c) of the method, the surfaces of the first and second metal layers 2, 4 are contacted for a heat-bonding without new contact with air, so as to avoid the generation of a new native oxide 7 (FIG. 6). According to step d), a heat treatment for annealing the bonding completes the assembling of the thus formed structure 300. Demixing the oxygen originating from the native oxides 7 allows a metal-metal contact at the bonding interface so that a high bonding energy is obtained.

According to a variant of the invention described in FIGS. 7 to 12, the method of the invention comprises providing a first stack 100 including a first silicon substrate 1 covered with a Ti barrier layer 5. A first metal layer 2 of copper deposited on the barrier layer 5 comprises therein a first Zr buried solubilization layer 6 (step a) FIGS. 7 to 9).

Similarly, the method comprises providing a second stack 200 including a second silicon substrate 3 covered with a Ti barrier layer 5 on which has been deposited a second copper metal layer 4 in which is buried a second Zr solubilization layer 8 (step b) FIG. 10). The first and second stacks 100, 200 include each a native oxide 7 formed under ambient atmosphere at the surface of the first and second metal layers 2, 4.

The first and second stacks 100, 200 are then contacted in order to obtain a direct metal bonding between the first and second metal layers 2, 4 (step c) FIG. 11) and form an assembled structure 300. Then according to step d) of the method, a heat treatment for annealing the bonding is applied at a temperature lower than 600° C. so as to activate the getter material according to step e) of the method for the solubilization of oxygen, allow the capture of oxygen originating from the native oxide 7 and achieve a bonding energy greater than 2 J/m$^2$.

According to one possibility, an adhesion layer, in particular made of SiO2, may be provided between the semiconductive material of the substrates 1, 3 and the metal layer 2, 4 to ensure good mechanical strength between the two materials.

According to one variant, a single solubilization layer 6, 8 is used to adsorb oxygen from the native oxide 7 during the direct bonding.

Furthermore, the invention also applies to the first and second substrates 1, 3 selected from semi-conductive materials, the first and second metal layers 2, 4 may be made of any metal naturally oxidizing in air such as Ti, Al, Au, Ag, Cu, Co, Ni, Pt, Fe, Cr, Ru, Mo, Ta, Nb, Re, W and the metal alloys of these metals, preferably deposited in the columnar form. The getter materials are selected from titanium, zirconium, palladium, hafnium, vanadium and metal alloys of these metals.

Thus, the present invention provides a direct metal bonding method carrying out a heat treatment at low temperature while obtaining a bonding energy compatible with steps of BEOF methods and not exceeding a certain method temperature. This method is simple to implement, applicable to many materials and inexpensive. It results in assembled structures 300 having a vertical conduction and a mechanical strength to the thinning after bonding.

It goes without saying that the invention is not limited to the embodiment described above as example but that it encompasses all technical equivalents and variants of the described means as well as their combinations.

The invention claimed is:

1. A direct metal bonding method comprising the following steps:
   a) providing a first stack comprising a first substrate on which is a first metal layer comprising a first metal, and a first solubilization layer distinct from the first metal layer, the first solubilization layer being in direct contact with and covered by the first metal layer, the first solubilization layer including a first getter material configured to solubilize oxygen, the first metal layer being covered by a first native oxide;
   b) providing a second stack comprising a second substrate on which is a second metal layer comprising a second metal, the second metal layer being covered by a second native oxide;
   c) contacting the first metal layer and the second metal layer so as to obtain a direct metal bonding between the first metal layer and the second metal layer, the first and second native oxides being encapsulated at a bonding interface;
   d) applying a heat treatment for annealing the bonding under a pressure less than or equal to about 0.1 MPa applied on either side of the first and second stacks; and
   e) applying an activation heat treatment for solubilizing oxygen of the first and second native oxides by the first getter material so as to obtain a direct metal bonding between the first metal layer and the second metal layer.

2. The method according to claim 1, wherein step e) is carried out by step d).

3. The method according to claim 1, wherein step e) is carried out prior to step c).

4. The method according to claim 1, further comprising:
   j) depositing the first metal layer according to deposition conditions promoting presence of grain boundaries prior to step a).

5. The method according to claim 4, wherein step j) includes depositing the first solubilization layer on the first substrate prior to deposition of the first metal layer.

6. The method according to claim 1, further comprising:
   jj) depositing the second metal layer according to deposition conditions promoting presence of grain boundaries prior to step b).

7. The method according to claim 1, further comprising one of:
   j) depositing the first metal layer in a columnar structure prior to step a); and
   jj) depositing the second metal layer in the columnar structure prior to step b).

8. The method according to claim 1, wherein the second stack further comprises a second solubilization layer distinct from the second metal layer, the second solubilization layer including a second getter material configured to solubilize oxygen.

9. The method according to claim 1, wherein the first solubilization layer comprises an alloy of first metal and first getter material.

10. The method according to claim 1, wherein the first solubilization layer is buried within the first metal layer.

11. The method according to claim 1, wherein step a) includes application of an activation heat treatment under inert atmosphere, so as to activate the first getter material for solubilization of oxygen.

12. The method according to claim 1, wherein step d) is performed at a temperature lower than or equal to 600° C. and a bonding energy between the first metal layer and the second metal layer reaches a value greater than or equal to 1 J/m$^2$.

13. The method according to claim 1, wherein the first solubilization layer is configured to solubilize oxygen greater than or equal to 20 atomic %.

14. The method according to claim 1, wherein the first getter material is selected from: titanium, zirconium, palladium, hafnium, vanadium, and metal alloys thereof.

15. The method according to claim 1, wherein the first metal and the second metal are selected from Ti, Al, Au, Ag, Cu, Co, Ni, Pt, Fe, Cr, Ru, Mo, Ta, Nb, Re, W, and metal alloys thereof.

16. The method according to claim 1, wherein step a) or step b) comprises:
  k) depositing a barrier layer forming a barrier for diffusing contaminating materials directly on the first substrate or the second substrate, the barrier layer comprising a material selected from: TiN, WN, and TaN.

17. The method according to claim 1, wherein the first substrate or the second substrate is composed of a semi-conductive material.

18. A structure having a direct metal bonding interface for applications in 3D integration and obtained by the direct metal bonding method of claim 1, the structure comprising, successively from its base to its surface:
  the first substrate of a first semi-conductive material;
  the first solubilization layer including the first getter material configured to solubilize oxygen;
  the first metal layer of the first metal, distinct from the first solubilization layer and bonded by direct metal bonding to the second metal layer of the second metal, the first metal layer being covered by the first native oxide, the first and second native oxides being encapsulated at the bonding interface; and
  the second metal layer, the second metal layer being covered by the second native oxide, the second metal layer having a second solubilization layer distinct from the second metal layer, including a second getter material configured to solubilize oxygen, and the second substrate of a second semi-conductive material.

19. A direct metal bonding method comprising the following steps:
  a) providing a first stack comprising a first substrate on which is deposited a first metal layer comprising a first metal, and a first solubilization layer distinct from the first metal layer, the first solubilization layer being in direct contact with the first metal layer, the first solubilization layer including a first getter material configured to solubilize oxygen, the first metal layer being covered by a first native oxide;
  b) providing a second stack comprising a second substrate on which is deposited a second metal layer comprising a second metal, and a second solubilization layer distinct from the second metal layer, the second solubilization layer being in direct contact with the second metal layer, the second solubilization layer including a second getter material configured to solubilize oxygen, the second metal layer being covered by a second native oxide;
  c) applying an activation heat treatment for solubilizing oxygen of the first and second native oxides by the first getter material and the second getter material respectively, step c) being carried out prior to step d);
  d) contacting the first metal layer and the second metal layer without new contact with air; and
  e) applying a heat treatment for annealing the bonding, step e) being applied under a pressure less than or equal to about 0.1 MPa applied on either side of the first and second stacks.

* * * * *